United States Patent
Lackey et al.

(10) Patent No.: US 8,504,971 B2
(45) Date of Patent: Aug. 6, 2013

(54) METHOD AND DEVICE FOR SELECTIVELY ADDING TIMING MARGIN IN AN INTEGRATED CIRCUIT

(75) Inventors: David E. Lackey, Jericho, VT (US); Chandramouili Visweswariah, Croton-on-Hudson, NY (US); Paul S. Zuchowski, Jericho, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/355,099

(22) Filed: Jan. 20, 2012

(65) Prior Publication Data

US 2012/0124538 A1 May 17, 2012

Related U.S. Application Data

(62) Division of application No. 11/869,306, filed on Oct. 9, 2007, now Pat. No. 8,122,409.

(51) Int. Cl.
*G06F 17/50* (2006.01)
*G06F 9/455* (2006.01)

(52) U.S. Cl.
USPC .......................... 716/134; 716/111; 716/113

(58) Field of Classification Search
USPC ........................................ 716/111, 113, 134
See application file for complete search history.

(56) References Cited

U.S. PATENT DOCUMENTS

| | | | |
|---|---|---|---|
| 5,508,937 A | 4/1996 | Abato et al. | |
| 5,636,372 A | 6/1997 | Hathaway et al. | |
| 6,279,142 B1 | 8/2001 | Bowen et al. | |
| 7,089,143 B2 | 8/2006 | Foreman et al. | |
| 7,111,260 B2 | 9/2006 | Visweswariah | |
| 2003/0204350 A1 | 10/2003 | Rearick et al. | |
| 2005/0182587 A1 | 8/2005 | Sato et al. | |
| 2007/0050742 A1 | 3/2007 | Yonezawa | |
| 2007/0288822 A1 | 12/2007 | Lin et al. | |
| 2008/0034338 A1 | 2/2008 | Hosono | |
| 2008/0052656 A1 | 2/2008 | Foreman et al. | |
| 2008/0216036 A1 | 9/2008 | Foreman et al. | |
| 2008/0270953 A1 | 10/2008 | Foreman et al. | |
| 2008/0320428 A1 | 12/2008 | Lin | |
| 2009/0037854 A1 | 2/2009 | Bittlestone et al. | |

OTHER PUBLICATIONS

Office Action dated Aug. 31, 2012 for U.S. Appl. No. 13/354,715.
Office Action dated Jul. 11, 2012 for U.S. Appl. No. 13/355,065.
Iyengar et al., "At-Speed Structural Test for High-Performance ASICs", 2006, IBM Microelectronics, International Test Conference, pp. 1-10.
Notice of Allowance dated Mar. 6, 2013 in U.S. Appl. No. 13/354,715, 17 pages.

*Primary Examiner* — Suresh Memula

(74) *Attorney, Agent, or Firm* — Richard Kotulak; Roberts Mlotkowski Safran & Cole, P.C.

(57) ABSTRACT

A method, system, and integrated circuit including selectively added timing margin. The method, for integrating statistical timing and automatic test pattern generation (ATPG) to selectively add timing margin in an integrated circuit, includes identifying, while a chip is in design, paths that are unable to be robustly tested "at speed" during manufacturing test, running statistical timing to calculate a margin to be applied to the paths, updating design specifications for margin to be applied to the paths, and optimizing chip logic based on updated design specifications.

16 Claims, 3 Drawing Sheets

METHOD AND DEVICE FOR SELECTIVELY ADDING TIMING MARGIN IN AN INTEGRATED CIRCUIT

CROSS REFERENCE TO RELATED APPLICATIONS

The present application is a divisional application of copending U.S. application Ser. No. 11/869,306, filed on Oct. 9, 2007, the contents of which are incorporated by reference in their entirety herein.

FIELD OF THE INVENTION

The invention generally relates to methods and devices for identifying integrated circuit chips manufactured correctly but whose performance does not meet specifications due to parametric variations.

BACKGROUND OF THE INVENTION

Defects in the manufacturing process of integrated circuits can result in circuits that do not meet the required specifications. These defects can result in hard failures or catastrophic faults, e.g., short circuits or open circuits, or can manifest themselves as subtle changes in electrical operation or parametric faults, e.g., increased current leakage or changes in circuit timing. The above-noted defects can be identified through a manufacturing test process, whereby only parts meeting all specifications are labeled as "good."

In recent generations of CMOS process, the number of defects manifested as changes in electrical performance has been increasing. One method of finding these defects is through the use of "functional patterns" at manufacturing test to find defective parts. This method is flawed, however, because the coverage of faults in the design is usually limited. Also, functional patterns are highly sequential which result in a large, costly, pattern set occupying a lot of time on the tester.

A better method for finding these defects is an at-speed structural test, in which a test vector is set up using low-speed scan testing and the vector is exercised using the at-speed functional clock. The results are scanned out using low-speed clocks and compared to expected results. Since critical paths can be isolated in structural testing, high coverage can be achieved with an efficient pattern set using this method. However, certain faults remain difficult or impossible to test.

In recent years, normal manufacturing tolerances have become a more significant issue in digital design. With continued scaling in CMOS technologies, atomic and quantum effects now result in measurable parameter variation. As the size of the circuit features approach the atomic level, the impact of these variations increase, i.e., they become a larger percentage of the total process range. In older generations of CMOS technology, it was common to design circuits with a "buy all" strategy, i.e., the manufacturing facility would produce a model of the transistors representing a "worst case" or a "best case" process, e.g., a SPICE model. Circuit designers use the SPICE model to predict circuit performance. As long as the manufacturing line stayed within the process defined by the best case and worst case SPICE models, chips designed with these circuits, assuming they are defect free, would perform to the required specifications. However, process conformance measurement is limited, and often only indirectly measurable using process monitor structures placed at certain chip locations.

Today, the "buy all" philosophy is limited to low performance designs. For higher performance designs, if we were to apply a "buy all" philosophy, then all the variations would have to be worst-cased, and this would result in a design closure methodology that was too slow and does not meet the performance needs of the design. So even though the performance is achievable in some portion of the manufacturing window, one would not be able to close timing on such a design. Further, to obtain the highest yield possible, statistical timing techniques are used to design these chips, which allow the design team to optimize each path in the presence of manufacturing variation by predicting the sensitivity to the variation and the magnitude of the delay change of each path due to that variation.

If the design team is going to assume some process yield loss due to variation, a method is needed to identify chips that, while otherwise good, fail to meet performance specifications. In practice, this can be done with some form of delay testing. Typical methods include using specific test patterns developed by the design team, e.g., functional patterns, or a newer method where the test patterns may be derived from software that systematically looks to test a transition at each internal node or at selected internal nodes.

When chips are designed using statistical methods, a satisfactory method and device for identifying and/or "weeding out" correctly manufactured chips whose performance doesn't meet the specifications is needed. While this "weeding out" can be performed with some kind of delay based manufacturing test, these tests do not provide 100% coverage for all paths, i.e., timing requirements for some paths may not be tested at the intended performance. Thus, the chip can pass the manufacturing test even though it includes untested timing requirements that are sub-standard, e.g., due to normal process variation. In this event, the chip will be shipped to customers, and the sub-standard untested timing requirements will not be identified until the system test stage or, even worse, in the field.

SUMMARY OF THE INVENTION

According to an aspect of the invention, a method is provided for integrating statistical timing and automatic test pattern generation (ATPG) to selectively add timing margin in an integrated circuit. The method includes identifying, while a chip is in design, paths that are unable to be robustly tested "at speed" during manufacturing test, running statistical timing to calculate a margin to be applied to the paths, updating design specifications with additional margin to be applied to the paths, and optimizing chip logic based on updated design specifications.

In accordance with another aspect of the invention, a method is provided for testing an integrated circuit. The method includes identifying, after initial logic entry of a circuit design, paths not testable in an at speed manufacturing test, adding margin to at least one of the identified paths and endpoints of the identified paths, determining whether the circuit design is acceptable, and manufacturing the integrated circuit from acceptable circuit design.

According to still another aspect of the invention, a system is provided for testing an integrated circuit. The system includes a design entry device for entering initial logic of a circuit design, an analyzer for identifying, after the design entry device, paths not testable in an at speed manufacturing test, a compensating device for adding margin to at least one of the identified paths and endpoints of the identified paths, a test unit to determine the circuit design is acceptable, and manufacturing apparatus to form the integrated circuit from the acceptable circuit design.

In accordance with yet another aspect of the invention, an integrated circuit is provided. The integrated circuit includes a plurality of paths testable by an at speed manufacturing test, and a plurality of paths not testable by the at speed manufacturing test. The plurality of paths not testable by the at speed manufacturing test are composed of at least one path having a variable amount of margin added to at least one of the at least one path and an endpoint of the at least one path.

DETAILED DESCRIPTION OF EMBODIMENTS OF THE INVENTION

To minimize the risk of "passing" chips having failing untested timing requirements, a method and device for identifying chips manufactured correctly but whose performance does not meet specifications is provided. Further, it may be particularly advantageous to identify such chips as early as possible, e.g., before physical conversion to silicon, and preferably, during the chip design flow process.

Moreover, to better ensure correct operation despite the untested paths on the chip, it may be advantageous to identify the untested paths on the chip and to add suitable timing margin to these paths, e.g., using a statistical timing engine. In this manner, a determination can be made as to which circuits to which to add margin and how much margin to add.

Figure 1:
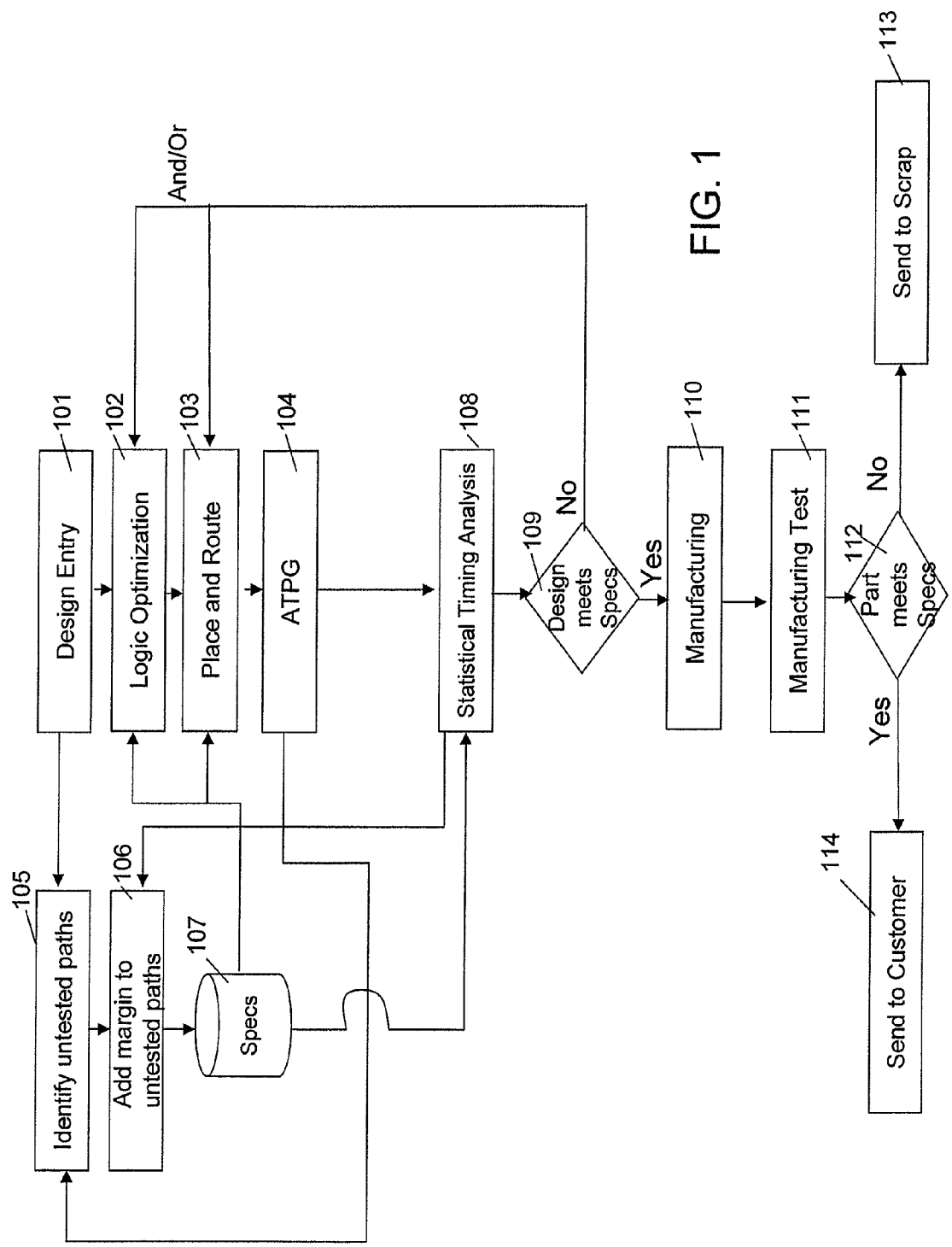
FIG. 1 illustrates a flow diagram for the methodology of designing, manufacturing and testing an integrated circuit chip according to the invention.

A flow diagram 100 for the design, manufacture and test of an integrated circuit is depicted in FIG. 1. The process may be initiated at the design entry at step 101, which can be a point in time after the chip has been designed to perform specified logic requested by a customer. The design may be composed of a gate level net list or a text (or binary) based description of all circuits and interconnects on the chip. The logic in the chip design may be optimized at step 102, e.g., to automatically tune the net list, e.g., to insert buffer circuitry, etc., and then a physical manifestation of the circuit can be achieved in a place and route procedure at step 103. This physical manifestation of the circuit can be attained in any conventional manner, such as a software representation. An automatic test pattern generation (ATPG) is provided at step 104. The ATPG determines which transistors and/or paths of the physical manifestation of the circuit will be tested in an "at speed" manufacturing test, i.e., the clock frequency on the tester is, or can be adjusted to be, about the same as the clock frequency of the end application. By way of example, a phase locked loop (PLL) can be utilized to generate, even from a slow tester clock, a clock on the chip or die running at or near the frequency of the end application.

At step 105, the untested paths are identified. In accordance with the invention, there are two types of paths that will not be tested, i.e., paths identifiable as untested by the design entry at step 105 and paths identifiable as untested by the ATPG at step 104. With regard to untested paths identified by the design entry, "off chip" elements cannot be tested, such that a primary input (PI) to latch path and a latch to primary output (PO) path would be untested. Further, paths arranged to cross clock domains, identifiable from the design entry, will be untested. As noted above, as the ATPG at step 104 determines which transistors and/or paths of the physical manifestation of the circuit will be tested in a manufacturing test, the remaining transistors and/or paths not within the generated test pattern will not be tested by the manufacturing test. Depending on the details of the design, the test method and the ATPG software, various other paths or sections of the circuit may be untestable or too difficult to test, and the present invention applies to all such cases.

Once the untested transistors and/or paths have been identified, margin can be added to these untested transistors and/or paths at step 106, which allows the chip to be more robustly designed. Margin may be added to the untested paths. By way of example, a constant margin, e.g., 50 psec., may be added to each identified untested transistor and/or path, e.g., to the endpoint at the end of the path. One manner of adding margin to the endpoint is through an additional guard time for a setup or hold test.

Once the margin is added to the untested paths at step 106, the timing assertions or timing constraints or performance specifications (labeled "specs" in FIG. 1) can be updated to include the added margin at step 107. As part of a chip design flow, specs are entered along with original logic design, and the specs can be used throughout the chip design flow to verify whether the chip will meet necessary performance objectives. Moreover, the specs can drive the timing optimization tools at step 102 and can drive the place and route procedure at step 103. Thus, when the steps for optimization or physical synthesis are run, the updated specs can be utilized to optimize the design and to add margin to the untested transistors and/or paths. A statistical timing analysis at step 108 utilizes the updated specs and the ATPG to iterate through timing closures and test/timing analysis until a determination is made at step 109 that the design meets specs. If the design does not meet specs at step 109, the process can return to step 102 and/or step 103. When the design meets specs at step 109, the design is manufactured, e.g., physically converted into silicon, at step 110.

The manufactured chip can then be tested at step 111, which includes an at speed manufacturing test for the paths included as part of the ATPG. If the part or chip fails to pass testing at step 112, the chip is sent to scrap at step 113. Otherwise, the part or chip passes at step 112, such that the chip can be identified as good and may then be sent to the customer at step 114.

Figure 2:
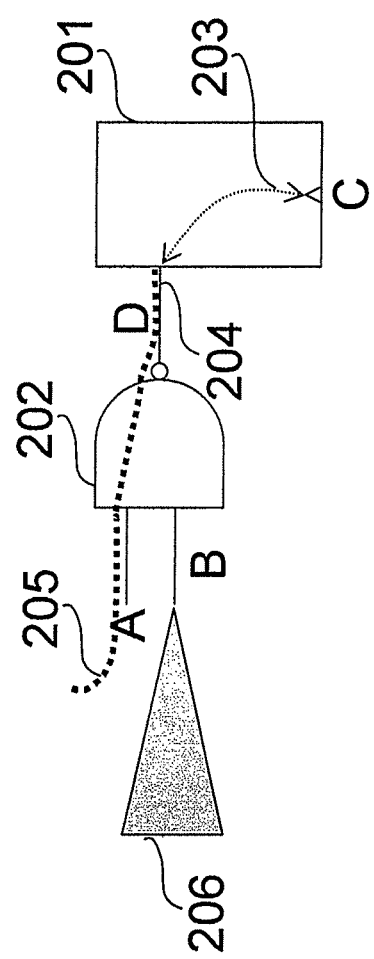
FIG. 2 illustrates a sample circuit and four ways of applying additional margin.

The margin discussed above with reference to step 106 can be taken into account in different ways during timing. In reference to FIG. 2, a sample circuit is shown consisting of a sequential element 201, whose data pin is fed by a NAND gate 202. The sequential element has setup and hold timing tests 203 between the data and clock pins of the sequential element. One way of applying additional margin is by increasing the guard time of the timing test 203. In this method, only the setup or hold test of interest that is not testable is penalized by the additional margin. A second way of applying additional margin is by asserting an arrival time adder at the end-point, which is the output of the NAND gate. In this method, the timing test of the sequential element as well as any other fanout of the NAND gate will be penalized by the additional margin. A third way of applying additional margin is to assert an additional delay on a particular path 205 as shown in FIG. 2. In this method, paths arriving at the sequential element through the B pin of the NAND gate are not penalized by the additional margin, whereas a specific path arriving through the A pin is penalized. A fourth way of applying additional margin is by asserting an additional delay on a particular internal timing point such as the B pin of the NAND gate. In this method, all paths that pass through the B pin of the gate (shown as the cone of logic 206) will be penalized by the additional margin, whereas paths not contained in that cone of logic will not be penalized. In this manner, specific timing tests, end points, paths or cones of logic can be penalized by additional margin. Depending on the capabilities of the timing tool and the set of paths or timing points to be penalized, one or more of these methods can be selected. It is to be noted that the additional delay that is asserted will be positive for late-mode delays and setup tests, whereas it will be negative for early-mode delays and hold tests.

While the constant margin example discussed above with reference to step 106 may be suitable, it may be advantageous to more selectively add margin according to the requirements of the transistor and/or path. By way of further example, through the statistical timing analysis of step 108, the variability of the timing slack for each timing test or end point can be determined. Paths which are close to critical and have larger variability will require larger margins, and paths which are non-critical and have lower variability will require smaller margins. The statistical timing analysis of step 108 knows the variability of timing slack by computing the sensitivity of slack to each source of variation, and stores these sensitivities in a so-called canonical form. The canonical form can be used to determine the additional margin required. For example, timing tests which can be tested by at-speed test could be projected to a 3-sigma value, while timing tests which cannot be tested by at-speed test could be projected to 4.5-sigma for additional process window protection. Thus various projection or conditional probability methods can be employed to compute the additional margin required so as to ensure correct operation even without testing the non-testable portions of the circuit. For example, process variables which are known to have tight control can be RSSed (Root of the Sum of the Squares of the sensitivities) whereas other process variables can be individually worst-cased. Another example is to require a certain more stringent (i.e., lower) probability of failure for non-testable timing tests and add as much margin as is necessary to meet that probability requirement. These calculations can be performed in a straightforward manner by one of ordinary skill in the art.

As a further alternative to the exemplary embodiment illustrated in FIG. 2, the above-noted arrangement of NAND gate and latch, if it were further assumed that path B is part of the at speed manufacturing test, but A is not, in accordance with another aspect of the invention, a variable amount of margin can be added to path A only. As is apparent from the foregoing, as path B will be tested at speed in the manufacturing test, it would not be necessary to add margin to this path.

Figure 3:
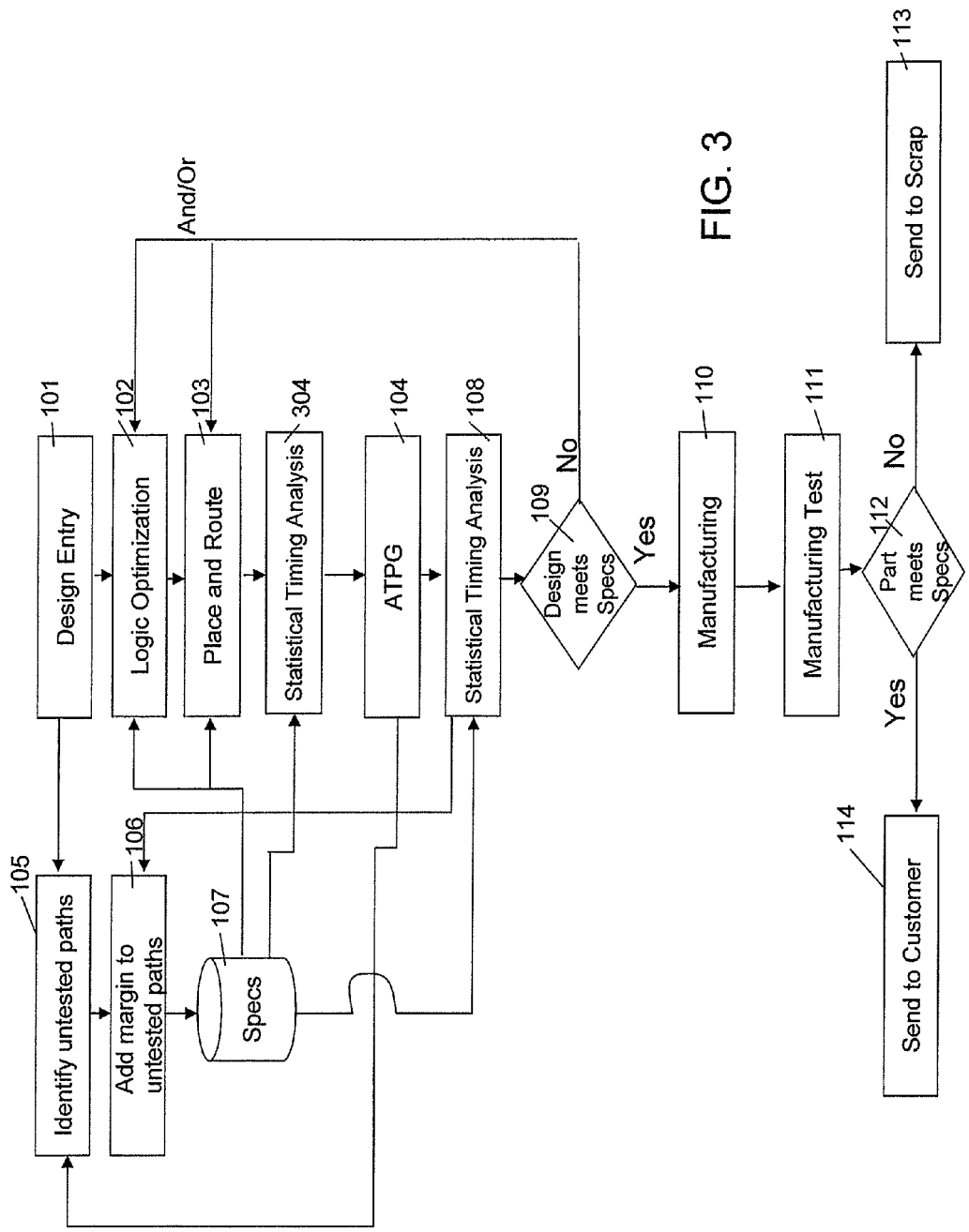
FIG. 3 illustrates a flow diagram for an alternative methodology of designing, manufacturing and testing an integrated circuit chip according to the invention.

As an integrated circuit chip contains an extremely large number of paths and gates, the performance of ATPG at step 104 to determine which transistors and/or paths of the physical manifestation of the circuit will be tested in an at speed manufacturing test can take a long period of time. In practice, many of the untested paths to be identified by the ATPG may not be an issue, but the performing of the ATPG will likely bog down the system. To reduce the time necessary to perform the ATPG, FIG. 3 illustrates an alternative exemplary embodiment of the invention. In this regard, the elements in FIG. 3 that correspond to elements shown in the exemplary embodiment shown in FIG. 1 are shown with the same reference numerals.

Thus, in contrast to the exemplary embodiment of FIG. 1, after achieving a physical manifestation of the circuit in a place and route procedure at step 103, a preliminary statistical timing analysis can be performed at step 304 to generate a list of "paths of interest" composed of, e.g., the top X paths, where X can be a user defined number, statistically most likely to be critical or to have a high process sensitivity. In this manner, the preliminary statistical timing analysis can pare down the number of paths to be processed by the ATPG in step 104, such that the response time for identifying untested or untestable paths can be significantly reduced. Hereafter, the process of FIG. 3 proceeds in the manner discussed above with regard to FIG. 1.

In an exemplary alternative to the exemplary flow diagrams depicted in FIGS. 1 and 3, steps 105 and 106, in which untested paths are identified and margin is added to these identified untested paths, may be replaced with a more conservative process. For example, the process can instead add margin to every path and subsequently remove the margin from those paths identified as testable. Further, a less conservative alternative process can be achieved through adding margin only to the "paths of interest" identified by the preliminary statistical timing analysis in step 304 of FIG. 3 that are not identified as testable. Thus the statistical timing analysis in step 304 serves two purposes: first, it helps to guide the ATPG to consider only timing critical paths and hence improves efficiency. Second, it helps to determine the right amount of margin for paths which are not tested.

The circuit as described above can be part of the design for an integrated circuit chip. The chip design may be created in a software program and can be stored in a graphical language (e.g., GDSII), e.g., in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed. Moreover, the process as described above is used in the fabrication of integrated circuit chips.

The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

While the invention has been described in terms of a preferred embodiment, those skilled in the art will recognize that the invention can be practiced with modifications within the spirit and scope of the appended claims. One of ordinary skill will be able to apply variants of these methodologies, apply different methods of computing and enforcing additional margin, and various ways of tailoring the invention to available timing tools, ATPG tools and test methodologies.

What is claimed is:

1. A system for testing an integrated circuit, comprising:
a design entry device for entering initial logic of a circuit design;
an analyzer for identifying, after the design entry device, paths not testable in an at speed manufacturing test;
a compensating device for adding margin to at least one of the identified paths and endpoints of the identified paths;
a test unit to determine the circuit design is acceptable; and
manufacturing apparatus to form the integrated circuit from the acceptable circuit design,
wherein the analyzer is structured and arranged to identify paths comprising off-chip connections, timing domain crossings, and paths located outside a generated test pattern for the at speed manufacturing test.

2. The system in accordance with claim 1, further comprising a statistical timing analyzer to test timing for all paths.

3. The system in accordance with claim 2, wherein the margin is a variable amount based upon the statistical timing analyzer.

4. The system in accordance with claim 2, wherein compensating device adds the margin to the at least one of the identified paths and endpoints of the identified paths in a variable amount.

5. The system in accordance with claim 4, wherein the variable amount is added to the endpoints of the identified paths.

6. The system in accordance with claim 1, further comprising a storage unit comprising performance specifications for the initial logic, wherein the storage unit updates the performance specifications based on the margin added to the at least one of the identified paths and the endpoints of the identified paths.

7. The system in accordance with claim 1, wherein the identified paths are determinable from paths not included within an automatic test pattern generation for the at speed manufacturing test.

8. The system in accordance with claim 1, wherein the margin is added to the endpoints through an additional guard time for a setup or hold test.

9. The system in accordance with claim 8, wherein the set up or hold test is between data and clock pins of a sequential element.

10. The system in accordance with claim 1, wherein the added margin is calculated by a statistical timing applied to the paths.

11. A system for testing an integrated circuit, comprising:
a design entry device for entering initial logic of a circuit design;
an analyzer for identifying, after the design entry device, paths not testable in an at speed manufacturing test;
a compensating device for adding margin to at least one of the identified paths and endpoints of the identified paths;
a test unit to determine the circuit design is acceptable; and
manufacturing apparatus to form the integrated circuit from the acceptable circuit design, wherein:
the margin is added to the endpoints through an additional guard time for a setup or hold test;
the additional guard time is positive for the setup test;
the additional guard time is negative for the hold test;
the additional delay at the output pin of the path is positive; and
the additional delay at the input pin of the path is negative.

12. A system for testing an integrated circuit, comprising:
a design entry device for entering initial logic of a circuit design;
an analyzer for identifying, after the design entry device, paths not testable in an at speed manufacturing test;
a compensating device for adding margin to at least one of the identified paths and endpoints of the identified paths;
a test unit to determine the circuit design is acceptable; and
manufacturing apparatus to form the integrated circuit from the acceptable circuit design, wherein:
the added margin is calculated by a statistical timing applied to the paths; and
the statistical timing determines variability of timing slack for each timing test or end point.

13. The system in accordance with claim 12, wherein:
paths which are close to critical and have larger variability require larger margins, and
paths which are non-critical and have lower variability require smaller margins.

14. The system in accordance with claim 13, wherein the statistical timing analysis knows the variability of the timing slack by computing sensitivity of slack to each source of variation, and storing these sensitivities in a canonical form used to determine the additional margin required.

15. The system in accordance with claim 14, wherein conditional probability methods are employed to compute the additional margin required.

16. The system in accordance with claim 15, wherein:
process variables which are known to have tight control are RSSed (Root of the Sum of the Squares of the sensitivities); and
remaining process variables are individually worst-cased.

* * * * *